(12) United States Patent
Barthe

(10) Patent No.: US 9,812,634 B2
(45) Date of Patent: Nov. 7, 2017

(54) METHOD OF MAKING THICK FILM TRANSDUCER ARRAYS

(71) Applicant: Ardent Sound, Inc., Mesa, AZ (US)

(72) Inventor: Peter G. Barthe, Phoenix, AZ (US)

(73) Assignee: Ardent Sounds, Inc., Mesa, AZ (US)

( * ) Notice: Subject to any disclaimer, the term of this patent is extended or adjusted under 35 U.S.C. 154(b) by 0 days.

(21) Appl. No.: 14/990,993

(22) Filed: Jan. 8, 2016

(65) Prior Publication Data

US 2016/0126451 A1    May 5, 2016

Related U.S. Application Data

(63) Continuation of application No. 13/863,362, filed on Apr. 15, 2013, now Pat. No. 9,263,663.

(60) Provisional application No. 61/623,571, filed on Apr. 13, 2012.

(51) Int. Cl.
*H01L 41/29*    (2013.01)
*H01L 41/22*    (2013.01)
*B06B 1/06*    (2006.01)

(52) U.S. Cl.
CPC ............. *H01L 41/22* (2013.01); *B06B 1/0622* (2013.01); *H01L 41/29* (2013.01); *Y10T 29/42* (2015.01)

(58) Field of Classification Search
CPC ....... B06B 1/0622; H01L 41/22; H01L 41/29; Y10T 29/42
See application file for complete search history.

(56) References Cited

U.S. PATENT DOCUMENTS

| | | | |
|---|---|---|---|
| 8,641,622 B2 * | 2/2014 | Barthe | A61B 5/682 600/439 |
| 8,708,935 B2 * | 4/2014 | Barthe | A61N 7/00 600/439 |
| 9,263,663 B2 * | 2/2016 | Barthe | B06B 1/0622 |

* cited by examiner

*Primary Examiner* — Minh Trinh
(74) *Attorney, Agent, or Firm* — Quarles & Brady LLP

(57) ABSTRACT

This disclosure provides methods of fabricating a transducer array. The methods can included creating a lens shaped depression in a backing material, printing an electrode, printing a thick layer of lead zirconate titanate material, printing a ground electrode, and placing a plurality of equally spaced cuts into the depression.

14 Claims, 3 Drawing Sheets

METHOD OF MAKING THICK FILM TRANSDUCER ARRAYS

CROSS-REFERENCE TO RELATED APPLICATIONS

This application is a continuation of U.S. patent application Ser. No. 13/863,362 filed Apr. 15, 2013, now U.S. Pat. No. 9,263,663, which claims benefit of U.S. Patent Application 61/623,571 filed Apr. 13, 2012, each of which are incorporated in its entirety by reference, herein

BACKGROUND

Currently, piezoelectric thick films which have typical thickness between 20 and 60 micrometers and high thickness coupling factor (comparable to those of bulk ceramic with similar compositions, i.e. over 40%) have been under development for high frequency transducer applications for several years. The corresponding resonant frequency range is 10-100 MHz or more. These piezoelectric thick films with high efficiency can be fabricated by different processes such as tape-casting or screen-printing or pad printing. These techniques can be applied to provide single element transducers. It is desirable to extend this technology to multiple element transducers with low cross-coupling.

SUMMARY

Various embodiments provide processes of fabrication to form acoustically and electrically isolated elements of a transducer array. For example, a cutting means such as use of a dicing saw, a laser, or etching, can be used on a cylindrically-focused transducer to form acoustically and electrically isolated elements of the transducer array.

Various embodiments provide methods of fabricating a transducer arrays. A method can include the steps of creating a lens shaped depression having dimensions of radius of curvature, elevation, and length into a face of a block of backing material; printing an electrode onto the depression and over an edge along the length of the depression; printing a thick layer of PZT material into the depression and on the electrode; printing a ground electrode into the depression and on the thick layer of PZT and over a distal edge along the length of the depression, wherein an electrode length over the edge is less than a ground length over the distal edge; placing a plurality of equally spaced cuts into the depression and perpendicular to the length, wherein in each of the cuts deeper than the electrode length and shorter that the ground length. In one embodiment, the method can include the step of creating isolated elements between the cuts.

DRAWINGS

The present disclosure will become more fully understood from the specification and the accompanying drawings, wherein.

DESCRIPTION

Figure 1:
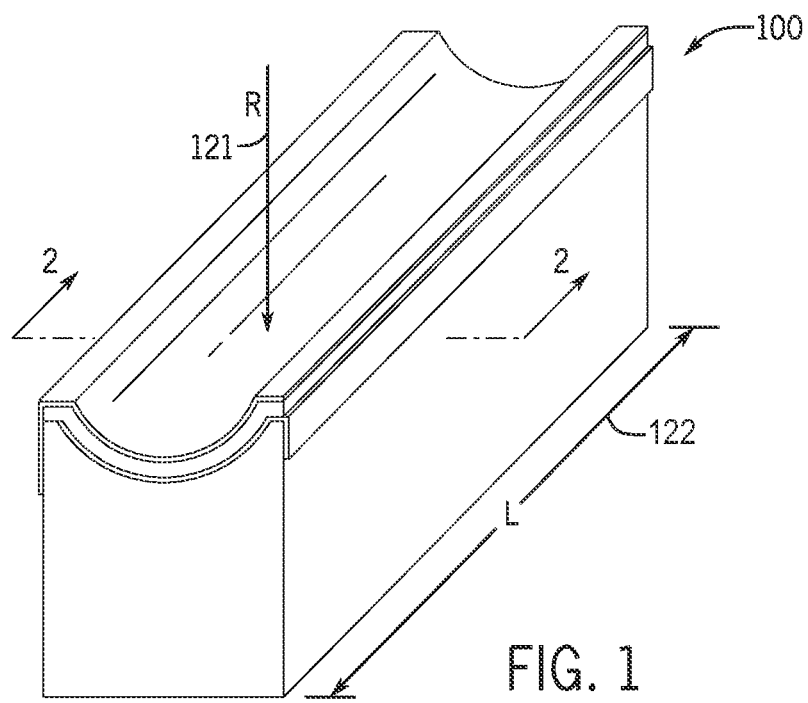
FIG. 1 is a prospective view illustrating a cylindrically-focused transducer, in accordance with various embodiments.

The following description is merely exemplary in nature and is in no way intended to limit the various embodiments, their application, or uses. As used herein, the phrase "at least one of A, B, and C" should be construed to mean a logical (A or B or C), using a non-exclusive logical or. As used herein, the phrase "A, B and/or C" should be construed to mean (A, B, and C) or alternatively (A or B or C), using a non-exclusive logical or. It should be understood that steps within a method may be executed in different order without altering the principles of the present disclosure.

The drawings described herein are for illustrative purposes only of selected embodiments and not all possible implementations, and are not intended to limit the scope of any of the various embodiments disclosed herein or any equivalents thereof. It is understood that the drawings are not drawn to scale. For purposes of clarity, the same reference numbers will be used in the drawings to identify similar elements.

The various embodiments may be described herein in terms of various functional components and processing steps. It should be appreciated that such components and steps may be realized by any number of hardware components configured to perform the specified functions. For example, various embodiments may employ various medical treatment devices, visual imaging and display devices, input terminals and the like, which may carry out a variety of functions under the control of one or more control systems or other control devices. In addition, the embodiments may be practiced in any number of medical contexts and that the various embodiments relating to a method and system for acoustic tissue treatment as described herein are merely indicative of exemplary applications for the invention. For example, the principles, features and methods discussed may be applied to any medical application.

Figure 2:
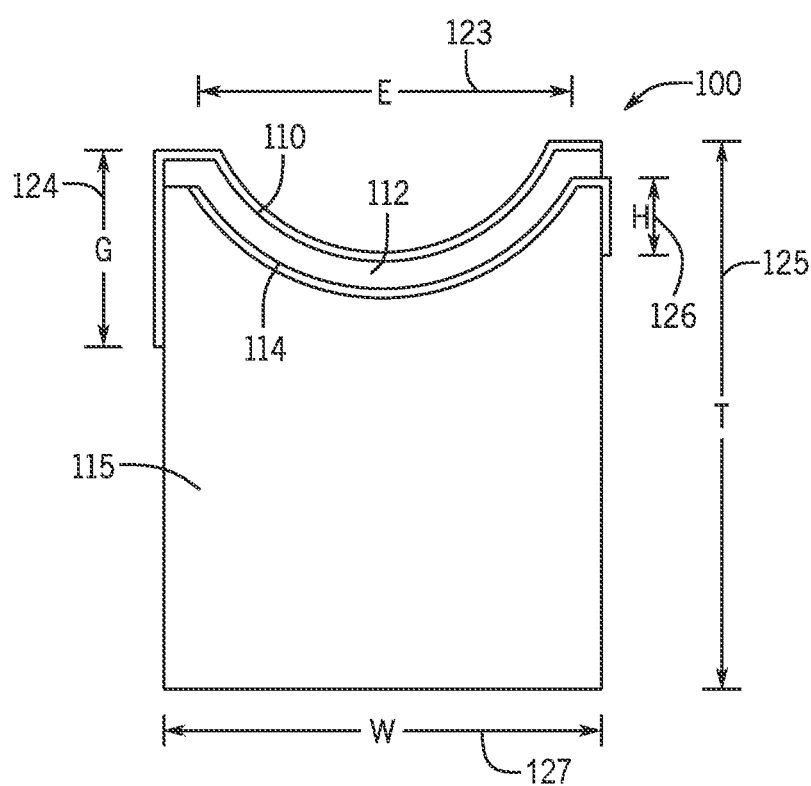
FIG. 2 is cross-section of FIG. 1 along the line 2-2, in accordance with various embodiments.
Figure 3:
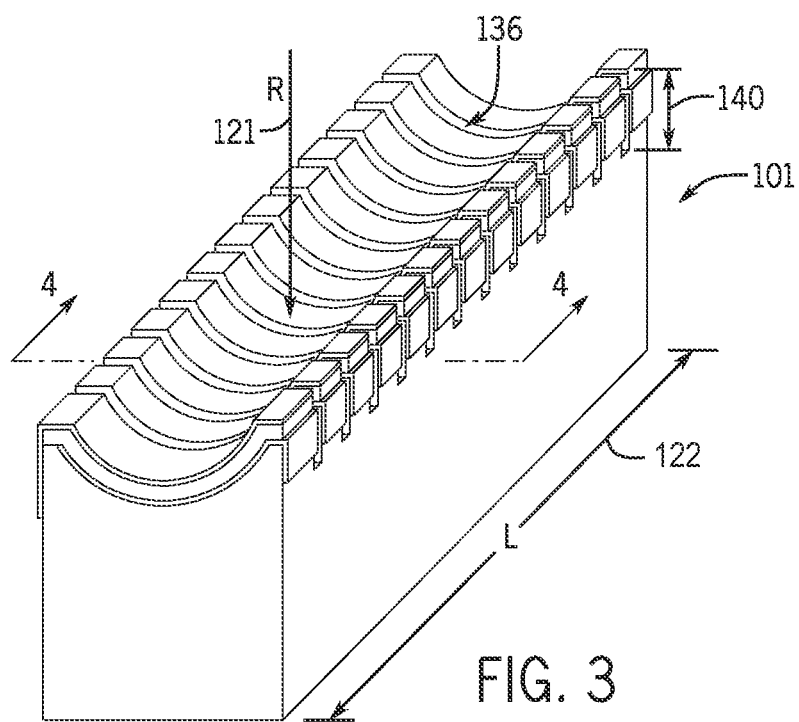
FIG. 3 is a prospective view illustrating a transducer array, in accordance with various embodiments.
Figure 4:
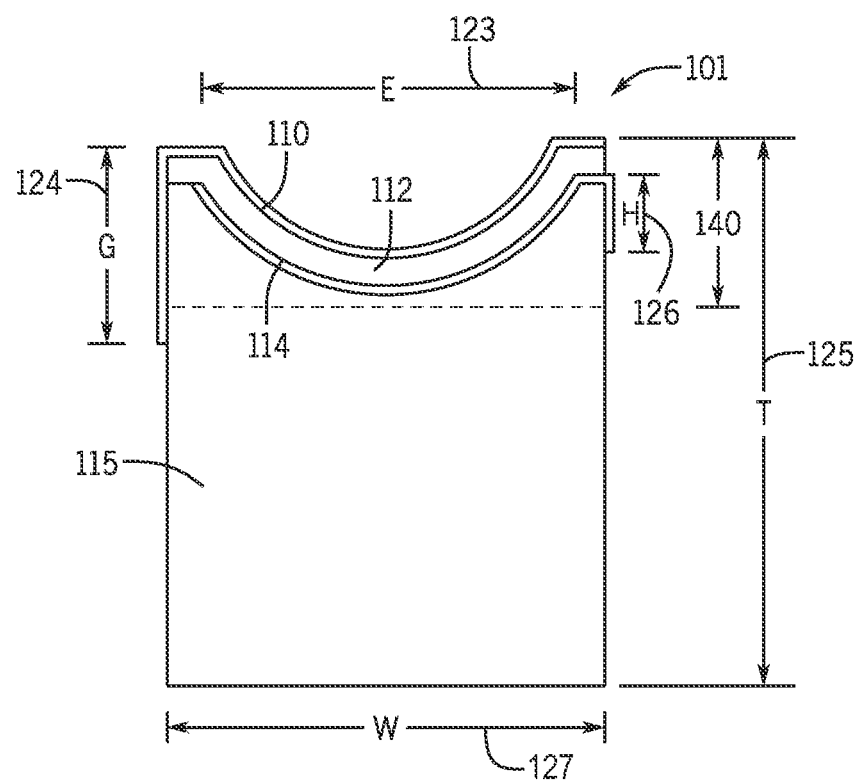
FIG. 4 is cross-section of FIG. 3 along the line 4-4, in accordance with various embodiments.
Figure 5:
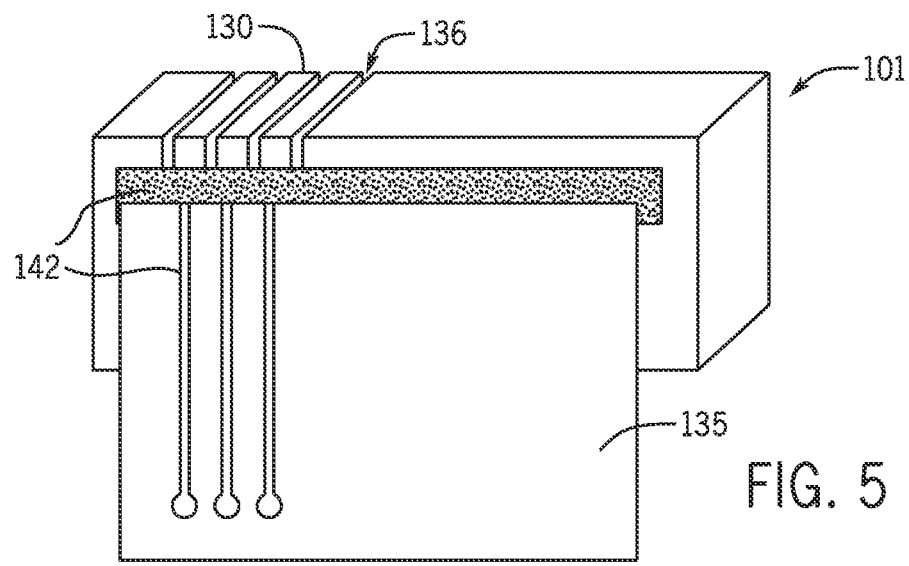
FIG. 5 is a side view illustrating a transducer array comprising a ribbon cable, in accordance with various embodiments.

Now with reference to FIGS. 1-2, a cylindrically-focused transducer 100 is illustrated. In accordance to various embodiments, cylinder transducer 100 can comprise a ground 110, a thick film 112, an electrode 114, and a backing material 115. Cylinder transducer 100 can have various dimensions, which can include length 122, width 127, and thickness 125. In addition, cylindrically-focused transducer 100 can have dimensions, which can include radius of curvature 121, elevation 123, ground length 124, and electrode length 126.

As illustrated in FIG. 2, cylindrically-focused transducer 100 comprises thick film 112, which is sandwiched between electrode 114 and ground 110. Electrode 114 is attached to backing 115. In various embodiments, thick film 114 is a piezo-electric material. A method of making cylindrically-focused transducer 100 can comprise the steps of attaching electrode 114 to backing material 115, coating electrode 114 with thick film 112, and placing ground 110 in contact with thick film 112.

In various embodiments, the fabrication and performance of a high frequency single element transducer uses a new integrated multilayer structure where a thick film is directly deposited on a spherical curved substrate by a pad-printing process. The addition of acoustical lens is then avoided. For example, a commercial porous PZT can be used as the transducer backing due to its scattering and lossy nature. By taking into account the conditions required for the fabrication process (such as high temperature for the sintering of the piezo-electric film) and acoustical properties of a standard backing for medical imaging, a porous PZT element can be used.

EXAMPLE 1

For example, cylindrically-focused transducer 100 can be fabricated using the following steps. Backing material 115 can be made from a block, for example a block of porous PZT, which can be machined to the specified dimensions. A lens shaped depression can be machined into one of the faces of the block, which can have the dimensions of radius of curvature 121, elevation 123, and length 122. A smoothing layer can be printed into the lens shaped depression. Using a pad printing technique, electrode 114 can be placed into lens shaped depression. Thick film 112 can be a PZT paste, such as, for example, InSensor composition TF2100 which is a hard-doped ceramic NAVY type I (Ferroperm Pz26) with a sintering aid, milled to a tine grain size, and which can be mixed with an organic solvent. Thick film 112 can be pad printed onto electrode 114. Ground 110 can be pad printed onto thick film 112.

EXAMPLE 2

For example, cylindrically-focused transducer can have the following dimensions:

TABLE 1

| | |
|---|---|
| length 122 | 15 mm |
| width 127 | 4 mm |
| thickness 125 | 5 mm |
| radius of curvature 121 | 12 mm |
| elevation 123 | 3 mm |
| ground length 124 | 3 mm |
| electrode length 126 | 0.1 mm |

In various embodiments, a transducer array 101 is illustrated in FIGS. 3-7. In various embodiments, transducer array 101 can be fabricated from cylindrically-focused transducer 100. In various embodiments, the next step in the process of fabrication is to form acoustically and electrically isolated elements 130 of transducer array 101. For example, a cutting means such as use of a dicing saw, a laser, or etching, can be used on cylindrically-focused transducer 100 to form acoustically and electrically isolated elements 130. Since electrode length 126 is shorter than ground length 124, when cylindrically-focused transducer 100 is diced deep enough to depth 140, individual elements 130 can be electrically formed and the dicing kerf 136 can isolate the elements mechanically to reduce crosstalk. In one embodiment, a shallow mechanical isolation can be done with one method and a different electric isolation can be done by electrically isolating along the sides of transducer array 101 with a different method and/or effective depths.

In various embodiments, interconnect 135 is provided to extend the individual elements 130 of transduce array 101 through electrical coupling means 142 towards imaging electronics (not illustrated). For example, interconnect 135 can be an anisotropic interconnect, which conducts only along one axis, for example along the thickness, can be coupled to a plurality of electrodes 114 of transducer array 101. In one embodiment, a printed circuit of electrically conducting fingers connect interconnect 135 to the array elements 130. Interconnect 135 can include an adhesive which can bond to the printed circuit. Interconnect 135 can include electrical coupling means 142, such as, for example, solder, conductive epoxy, anisotropic adhesive, wire bonds, or other means, which can bond to the printed circuit. In one embodiment, a flexible printed circuit can be coupled to the elements 130 and connected to backing material 115. In some embodiments, cylindrically focused transducer 100 is mated to interconnect 135 via electrical coupling means 142 before dicing kerfs 136. In some embodiments, after interconnect 135 is coupled, the whole transducer array 101 can be coated or potted in one or more layers to provide mechanical and electric isolation and/or to form matching layers and/or lenses.

In another embodiment, electrodes 114 can be fabricated atop the backing material 115 as distinct, electrically-isolated conductive strips. For example, electrode 114 can be plated whole and then laser isolated or cut to produce a plurality of electrodes 114. For example, backing material 115 can be plated whole and then the fingers can be deposited as distinct conductive strips to produce a plurality of electrodes 114, including electrode length 126. In one embodiment, PZT thick film 112 can be placed on to the fingers, and then a contiguous top conductive ground 110 layers can be placed in to the PZT thick film 112, which is common to all the elements. The PZT In an aspect of this embodiment the PZT thick film 112 is highly anisotropic, such that in the thickness vibrational direction there is a large degree of electromechanical coupling, but much less in the lateral direction. In such a case it may be possible to achieve suitable performance without physical mechanical isolation such as cutting. No pillars are needed to isolate elements 130 of transducer array 101. In some embodiments, a plurality of equally spaced can be cuts into the depression and perpendicular to the length of the array 101. The plurality of equally spaced cuts can isolate each element 130 of the transducer array in at least one of electrically and mechanically. Isolated elements 130 or transduction elements can be created between the cuts. In some embodiments, each of the plurality of equally spaced cuts is deeper than a length of the electrode 114 and is shorter than a length of the ground 110.

In some embodiments, array 101 can be combined with another transducer, such as, for example, a second transducer array or a single element transducer. For example, a slot can be created or etched into the center of the single element transducer and array 101 can be affixed into the slot. In some examples the array 101 can be coupled to imaging electronics. In one example, an image can be displayed from the array 101 and ultrasound therapy can be delivered from the single element transducer.

In embodiments having a thin backing material 115, thick film 112 can be shaped into curved convex and concave arrays, and transducers with spherical or cylindrical foci can be formed as well. Two-dimensional and three-dimensional arrays can be fabricated based on using one or more sub-arrays.

In various embodiments, transducer array 101 has capability to form high- to extremely-high frequency arrays. In one embodiment, transducer array 101 can have a frequency range of about 2 MHz to about 20 MHz. In one embodiment, transducer array 101 can have a frequency range of about 20 MHz to about 60 MHz. In one embodiment, transducer array 101 can have a frequency range of about 50 MHz to about 100 MHz. In one embodiment, transducer array 101 can have a frequency range of about 10 MHz to about 30 MHz. In one embodiment, transducer array 101 can have a frequency range of above 20 MHz. In some embodiments, an acoustical matching layer can be coated over elements 130 of transducer array 101. In one embodiment, an acoustical matching layer can be quarter wavelength thick, which can amplify acoustic wave transmission and place the amplified acoustic wave in phase.

In one embodiment, transducer array 101 can be placed in a liquid-filled housing or other spatial standoff or half-space proximal to a region of interest (not illustrated). The distance of transducer array 101 from the region of interest is set so the resulting image in the region of interest does not have reverberation artifacts. This can be achieved by making the length of the standoff equal to or about the viewing depth, if the speeds of sound in the region-of-interest is approximately equal to the speed of sound in the standoff. To avoid this limit, in one embodiment of using the thick film array the time-of-flight is extended by the use of materials with low phase velocity compared to the region-of-interest. This magnifies the reverberation free image depth in the region of interest.

Figure 6:
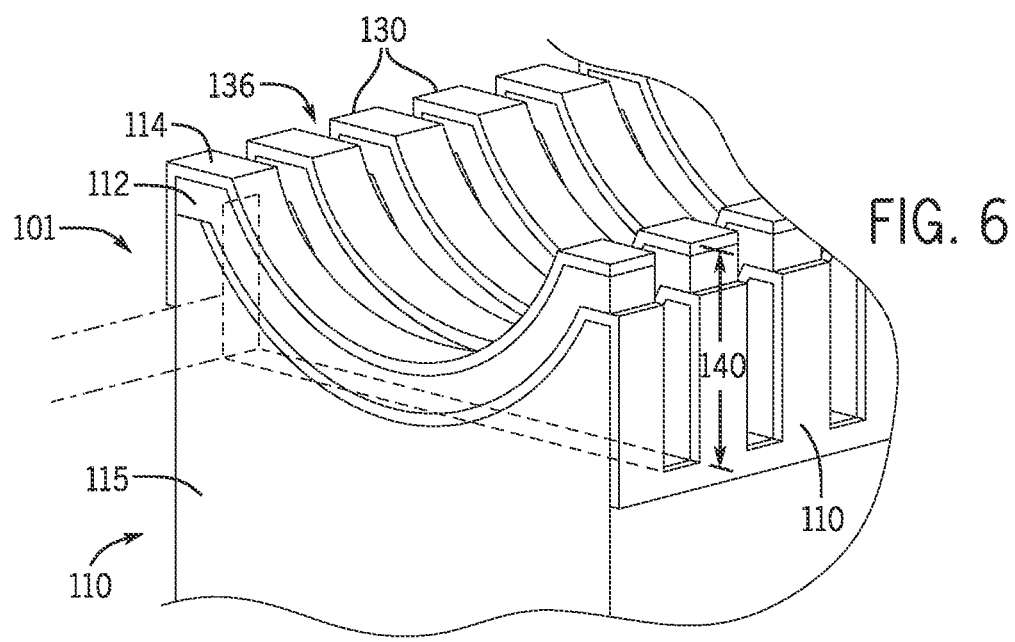
FIG. 6 is a prospective view illustration a portion of a transducer array, in accordance with various embodiments.
Figure 7:
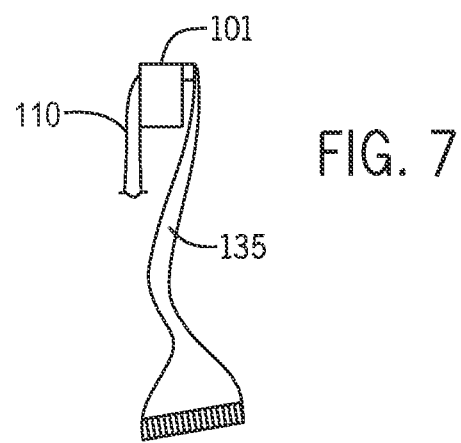
FIG. 7 is a front view of a transducer array comprising a ribbon cable, in accordance with various embodiments.

With reference to FIG. 6, transducer array 101 is illustrated with the location of electrode 114 and ground 110 reversed in relation to thick film 112. In some embodiments, ground 110 is attached to backing 115. In various embodiments, thick film 114 is a piezo-electric material, which is printed onto ground 110 and electrode 114 is printed onto thick film 112. A method of making transducer array 101 can comprise the steps of attaching ground 110 to backing material 115, coating ground 110 with thick film 112, and placing electrode 114 in contact with thick film 112. The method can include the steps of forming acoustically and electrically isolated elements 130 of transducer array 101, which can include creating kerf 136 between the elements 130 of transducer array 101. Since electrode length 126 is shorter than ground length 124, when transducer 101 is diced deep enough, individual elements 130 can be electrically formed and the dicing kerf 136 can isolate the elements mechanically to reduce crosstalk. In some embodiments, ground electrode length 124 can be diced through and then reconnected, as desired via electrical coupling means 142. In some embodiments, array elements 130 can be poled or re-poled after fabrication of transducer 100.

As used herein, the terms "comprise", "comprises", "comprising", "having", "including", "includes" or any variation thereof, are intended to reference a non-exclusive inclusion, such that a process, method, article, system, composition or apparatus that comprises a list of elements does not include only those elements recited, but may also include other elements not expressly listed or inherent to such process, method, article, system, composition or apparatus. Other combinations and/or modifications of the above-described structures, arrangements, applications, proportions, elements, materials or components used in the practice of the present invention, in addition to those not specifically recited, may be varied or otherwise particularly adapted to specific environments, manufacturing specifications, design parameters or other operating requirements without departing from the general principles of the same.

In the foregoing specification, the invention has been described with reference to specific embodiments. Various modifications and changes may be made, however, without departing from the scope of the various embodiments of the present invention, as set forth in the claims. The specification and Figures are illustrative, rather than restrictive, and modifications are intended to be included within the scope of any of the various embodiments of the present invention described herein. Accordingly, the scope of the invention should be determined by the claims and their legal equivalents rather than by merely the examples described.

For example, the steps recited in any method or process claims may be executed in any order and are not limited to the specific order presented in the claims. Additionally, the components and/or elements recited in any apparatus or system claims may be assembled or otherwise operationally configured in a variety of permutations and are accordingly not limited to the specific configuration recited in the claims.

Benefits, other advantages and solutions to problems have been described above with regard to particular embodiments; however, any benefit, advantage, solution to problem or any element that may cause any particular benefit, advantage or solution to occur or to become more pronounced are not to be construed as critical, required or essential features or components of any or all the claims.

The invention claimed is:

1. A method of fabricating a transducer array, the method comprising:
    a) printing a first electrode onto a lens shaped depression of a face of a block of backing material and over a first edge along a length of the depression;
    b) printing a layer of lead zirconate titanate (PZT) material into the depression and on the first electrode;
    c) printing a second electrode into the depression and on the layer of PZT and over a second edge along the length of the depression, wherein the first edge and the second edge are different, wherein a first length of the first electrode over the first edge is different than a second length of the second electrode over the second edge; and
    d) placing a plurality of cuts into the depression and perpendicular to the length, wherein the plurality of cuts electrically and mechanically isolate each element of the transducer array.

2. The method according to claim 1, the method further comprising coupling the transducer array to imaging electronics.

3. The method according to claim 2, further comprising displaying an image from the transducer array.

4. The method according to claim 1, the method further comprising combining the transducer array with another transducer.

5. The method according to claim 4, wherein the another transducer is a second transducer array.

6. The method according to claim 4, wherein the another transducer is a single element transducer.

7. The method according to claim 6, further comprising creating a slot in the center of the single element transducer, and fixing the transducer array in the slot.

8. The method according to claim 1, wherein the printing of step a), step b), step c) or a combination thereof is configured to provide a broad bandwidth to the transducer array.

9. The method according to claim 1, further comprising integrating a lens to the transducer array.

10. The method according to claim 1, wherein each of the plurality of cuts is deeper than the shorter of the first length and the second length and is shorter than the longer of the first length and the second length.

11. The method according to claim 1, the method further comprising:
    forming another transducer; and combining the transducer array with the another transducer.

12. The method according to claim 11, wherein the another transducer is a second transducer array.

13. The method according to claim 11, wherein the another transducer is a single element transducer.

14. The method according to claim 13, further comprising creating a slot in the center of the single element transducer, and fixing the transducer array in the slot.

* * * * *